(12) United States Patent
Miki et al.

(10) Patent No.: US 8,947,290 B2
(45) Date of Patent: Feb. 3, 2015

(54) SUCCESSIVE APPROXIMATION AD CONVERTER

(71) Applicant: Panasonic Corporation, Osaka (JP)

(72) Inventors: Takuji Miki, Kyoto (JP); Shiro Sakiyama, Kyoto (JP); Naoshi Yanagisawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/071,195

(22) Filed: Nov. 4, 2013

(65) Prior Publication Data

US 2014/0077979 A1    Mar. 20, 2014

Related U.S. Application Data

(63) Continuation of application No. PCT/JP2011/004391, filed on Aug. 3, 2011.

(30) Foreign Application Priority Data

May 10, 2011  (JP) .................. 2011-105045

(51) Int. Cl.
  *H03M 1/12*  (2006.01)
  *H03M 1/10*  (2006.01)
  *H03M 1/46*  (2006.01)

(52) U.S. Cl.
  CPC .......... *H03M 1/1033* (2013.01); *H03M 1/1061* (2013.01); *H03M 1/466* (2013.01)
  USPC ........... 341/172; 341/118; 341/120; 341/155; 341/156

(58) Field of Classification Search
  CPC ..... H03M 1/403; H03M 1/468; H03M 1/804; H03M 1/466; H03M 1/40; H03M 1/46; H03M 1/0682; H03M 1/1061; H03M 1/129; H03M 1/145; H03M 1/002; H03M 1/0617; H03M 1/0692; H03M 1/0697; H03M 1/10
  USPC .......................... 341/118, 120, 155, 156, 172
  See application file for complete search history.

(56) References Cited

U.S. PATENT DOCUMENTS

| | | |
|---|---|---|
| 4,399,426 A | 8/1983 | Tan |
| 4,999,633 A | 3/1991 | Draxelmayr |

(Continued)

FOREIGN PATENT DOCUMENTS

| | | |
|---|---|---|
| JP | 02-155457 A | 6/1990 |
| JP | 2010-045723 A | 2/2010 |

OTHER PUBLICATIONS

International Search Report issued in PCT/JP2011-004391, dated Sep. 6, 2011.

*Primary Examiner* — Linh Nguyen
(74) *Attorney, Agent, or Firm* — McDermott Will & Emery LLP

(57) ABSTRACT

A higher-order DAC and a lower-order DAC each have a plurality of capacitive elements having capacitance values weighted with a binary ratio and are configured so that a first terminal of each of the capacitive elements is connected to a common node and a second terminal thereof is connected to either a first or second voltage selectively. The higher-order DAC and the lower-order DAC are coupled by a coupling capacitor. A higher-order DAC control circuit outputs either a correction control signal or a digital signal output from a successive approximation circuit selectively to the higher-order DAC. The lower-order DAC has at least one variable capacitive element of which a first terminal is connected to the common node and a second terminal is connected to either the first or second voltage selectively depending on a higher-order bit of the digital signal output from the successive approximation circuit to the higher-order DAC.

12 Claims, 6 Drawing Sheets

(56) References Cited

U.S. PATENT DOCUMENTS

| | | |
|---|---|---|
| 6,486,806 B1 * | 11/2002 | Munoz et al. .................. 341/120 |
| 6,686,865 B2 * | 2/2004 | Confalonieri et al. ........ 341/172 |
| 6,707,403 B1 * | 3/2004 | Hurrell .......................... 341/120 |
| 7,528,761 B2 * | 5/2009 | Draxelmayr .................. 341/172 |
| 7,609,184 B2 * | 10/2009 | Kuramochi et al. .......... 341/118 |
| 7,928,880 B2 * | 4/2011 | Tsukamoto .................... 341/144 |
| 8,111,178 B2 * | 2/2012 | Liao et al. ..................... 341/120 |
| 8,487,794 B2 * | 7/2013 | Huang et al. .................. 341/120 |
| 8,519,874 B2 * | 8/2013 | Aruga et al. .................. 341/120 |
| 2010/0039303 A1 | 2/2010 | Tsukamoto |
| 2013/0015996 A1 * | 1/2013 | Furuta ........................... 341/172 |
| 2013/0162454 A1 * | 6/2013 | Lin ................................ 341/120 |
| 2014/0253351 A1 * | 9/2014 | Kumar ........................... 341/118 |

* cited by examiner

US 8,947,290 B2

SUCCESSIVE APPROXIMATION AD CONVERTER

CROSS-REFERENCE TO RELATED APPLICATION

This is a continuation of PCT International Application PCT/JP2011/004391 filed on Aug. 3, 2011, which claims priority to Japanese Patent Application No. 2011-105045 filed on May 10, 2011. The disclosures of these applications including the specifications, the drawings, and the claims are hereby incorporated by reference in their entirety.

BACKGROUND

The present disclosure relates to a successive approximation AD converter, and more particularly to a successive approximation AD converter provided with a capacitance array type DA converter.

The successive approximation AD converter is configured to achieve multi-bit analog-to-digital conversion (AD conversion) by successively repeating comparison operation between an analog input voltage and a voltage generated by a digital-to-analog converter (hereinafter referred to as a DAC) from the highest-order bit to the lowest-order bit. The successive comparison operation includes controlling a digital input signal of the DAC based on the comparison result of the previous bit to generate a comparison target voltage for the next bit.

As the DAC, a capacitance array where capacitance values are weighted with a binary (powers of 2) ratio is often used. When such a capacitance array type DAC (hereinafter referred to as a capacitance DAC) is used, the capacitance value of a capacitance array corresponding to higher-order bits will increase as the number of bits increase, causing increase in the area and power consumption of the AD converter. To address this problem, a technique has been proposed where the capacitance array is divided into a higher-order part and a lower-order part and such parts are coupled by a coupling capacitor, thereby reducing the capacitance value of a capacitance array corresponding to higher-order bits (see Japanese Unexamined Patent Publication No. H02-155457, for example).

FIG. 7 shows a configuration of a typical 8-bit successive approximation AD converter. This successive approximation AD converter includes: a switch 1 that samples an analog input voltage; a capacitance DAC 200; a comparator 3; a latch circuit 4 that stores a comparison result; a successive approximation circuit 5 that outputs an 8-bit digital signal constituted by signals P1 to P8 based on an output signal of the latch circuit 4; and a serial-to-parallel conversion circuit 6 that converts the output signal of the latch circuit 4 to a multi-bit signal.

The capacitance DAC 200 includes: a higher-order side capacitance array (hereinafter referred to as a higher-order DAC) 201 and a lower-order side capacitance array (hereinafter referred to as a lower-order DAC) 202, where capacitance values are weighted with a binary ratio; and a coupling capacitor 203 that couples these arrays. The higher-order DAC 201 includes capacitive elements c1, c2, c3, and c4 and is configured so that a first terminal of each of the capacitive elements is connected to a common node and a second terminal thereof is independently connected to either a reference voltage VH or VL (where VH>VL) via a switch. The lower-order DAC 202 includes capacitive elements c5, c6, c7, and c8 and is configured so that a first terminal of each of the capacitive elements is connected to a common node and a second terminal thereof is independently connected to either the reference voltage VH or VL via a switch. Note that the capacitance values of the capacitive elements c1 to c8 are indicated near the corresponding capacitive elements in FIG. 7.

The operation of the successive approximation AD converter is as follows. First, the switch 1 is turned on to sample an analog input voltage. At this time, the digital signal input into the capacitance DAC 200 from the successive approximation circuit 5 is set to its initial value, which is (P1, P2, P3, P4, P5, P6, P7, P8)=(1, 0, 0, 0, 0, 0, 0, 0). The second terminal of each of the capacitive elements c1 to c8 is connected to VH when the corresponding bit of the input digital signal is 1 and to VL when it is 0. Therefore, the analog input voltage is first compared with a voltage corresponding to (VH−VL)/2, and which one of the voltages is large is decided by the comparator 3. The comparison result is stored in the latch circuit 4, whereby the value of the MSB of the output digital signal is determined, and also the digital signal output from the successive approximation circuit 5 is updated, whereby a comparison target voltage for the next bit is generated in the capacitance DAC 200.

More specifically, when the MSB is determined as 1, the signal P2 corresponding to the next bit is changed from 0 to 1 while the signal P1 corresponding to the highest-order bit is kept 1. By this change, the analog input voltage is compared with a voltage corresponding to 3 (VH−VL)/4, and which one of the voltages is large is decided by the comparator 3, to determine the value of the next bit. On the other hand, when the MSB is determined as 0, the signal P1 corresponding to the highest-order bit is changed to 1 to 0, and the signal P2 corresponding to the next bit is changed from 0 to 1. By this change, the analog input voltage is compared with a voltage corresponding to (VH−VL)/4, and which one of the voltages is large is decided by the comparator 3, to determine the value of the next bit.

The operation described above is repeated successively until the LSB of the output digital signal is determined. Finally, after the comparison decision results for all the bits are temporarily stored in the latch circuit 4, an 8-bit AD converted value is output from the serial-to-parallel conversion circuit 6 that is constituted by shift registers.

However, since a parasitic capacitance cp is generally present in the capacitance DAC 200, the weighting becomes different between the higher-order part and the lower-order part of the capacitance DAC 200, worsening the AD conversion precision. To address this problem, a technique is proposed where a variable capacitive element is provided in the lower-order part of the capacitance DAC and adjusted so that the charge transfer amount of the capacitive element corresponding to the lowest-order bit in the higher-order part and that of all the capacitive elements in the lower-order part are equal to each other (see Japanese Unexamined Patent Publication No. 2010-45723, for example).

Reducing the capacitance in a successive approximation AD converter having a capacitance DAC worsens mismatch precision, failing to produce capacitance values weighted with a correct binary ratio. In particular, degradation in the relative precision of a capacitance corresponding to a higher-order bit greatly affects degradation in AD conversion precision. While the mismatch precision can be improved by using a large capacitance, the increase in the capacitance of the capacitance DAC causes increase in the area and power of the entire AD converter. Also, in the technique of adjusting the higher-order part and lower-order part of the capacitance DAC described above, the voltage value at the time when the capacitive element corresponding to the lowest-order bit in the higher-order part and all the capacitive elements in the lower-order part are changed over with a switch is determined by a comparator. Therefore, no precise correction is possible when an offset is present in the comparator.

An AD converted value with good linearity and high precision depends on the precision of the capacitance values weighted with a binary ratio in the capacitance DAC. However, because of the above-described problems such as the deterioration in mismatch precision due to the capacitance reduction and the difference in weighting between the higher-order DAC and the lower-order DAC due to a parasitic capacitance in the lower-order DAC, an error occurs in the output of the capacitance DAC. As a result, the AD conversion results have nonlinear characteristics.

In view of the above, there is a need for a successive approximation AD converter with improved mismatch precision. Further, there is a need for a small-sized, low-power successive approximation AD converter capable of producing a high-precision AD converted value by correcting an error in the capacitance DAC even if an offset is present in the comparator.

SUMMARY

According to one aspect of the present disclosure, a successive approximation AD converter configured to convert an analog input voltage to a digital value includes: a capacitance DAC including a higher-order DAC having a plurality of capacitive elements having capacitance values weighted with a binary ratio, configured so that a first terminal of each of the capacitive elements is connected to a first common node and a second terminal thereof is connected to either a first or second voltage selectively depending on each bit of an input first digital signal, a lower-order DAC having a plurality of capacitive elements having capacitance values weighted with a binary ratio, configured so that a first terminal of each of the capacitive elements is connected to a second common node and a second terminal thereof is connected to either the first or second voltage selectively depending on each bit of an input second digital signal, and a coupling capacitor configured to connect the first common node and the second common node; a comparator into which a voltage generated by the analog input voltage and the capacitance DAC is input; a successive approximation circuit configured to determine the digital value sequentially starting from its MSB in response to the comparison result of the comparator, and output higher-order bits of the digital value as a third digital signal and lower-order bits thereof as the second digital signal; and a higher-order DAC control circuit configured to output either a correction control signal or the third digital signal selectively to the higher-order DAC as the first digital signal. The lower-order DAC has at least one variable capacitive element of which a first terminal is connected to the second common node and a second terminal is connected to either the first or second voltage selectively depending on a higher-order bit of the third digital signal.

Having the configuration described above, it is possible to measure an AD converted value obtained when the lower-order DAC is operated in the state where the correction control signal is input in the higher-order DAC as the first digital signal by the higher-order DAC control circuit, and, based on the measured value, determine the capacitance value of the variable capacitive element provided in the lower-order DAC. Also, by putting the higher-order DAC in the state where the third digital signal output from the successive approximation circuit is input in the higher-order DAC as the first digital signal by the higher-order DAC control circuit, the second terminal of the variable capacitive element can be connected to either the first or second voltage in an interlocking manner with the second terminal of a capacitive element corresponding to a higher-order bit in the higher-order DAC. In this way, capacitance mismatch in the higher-order DAC can be corrected.

To facilitate determination of the capacitance value of the variable capacitive element, the higher-order DAC may have a dummy capacitive element having a capacitance value equal to the capacitance value of a capacitive element corresponding to the lowest-order bit among the plurality of capacitive elements of the higher-order DAC, of which a first terminal is connected to the first common node and a second terminal is connected to either the first or second voltage selectively depending on the correction control signal.

The lower-order DAC may have another variable capacitive element of which a first terminal is connected to the second common node and a second terminal is grounded. With this configuration, even if a parasitic capacitance is present in the lower-order DAC, the weighting error between the higher-order DAC and the lower-order DAC can be corrected by appropriately adjusting the capacitance value of the another variable capacitive element. Note that the capacitance value of the another variable capacitive element can be determined based on an AD converted value obtained when the lower-order DAC is operated in the state where a predetermined value is input in the higher-order DAC. In other words, the capacitance value of the another variable capacitive element can be determined based on an AD converted value including the offset of the comparator.

DETAILED DESCRIPTION

Figure 7:
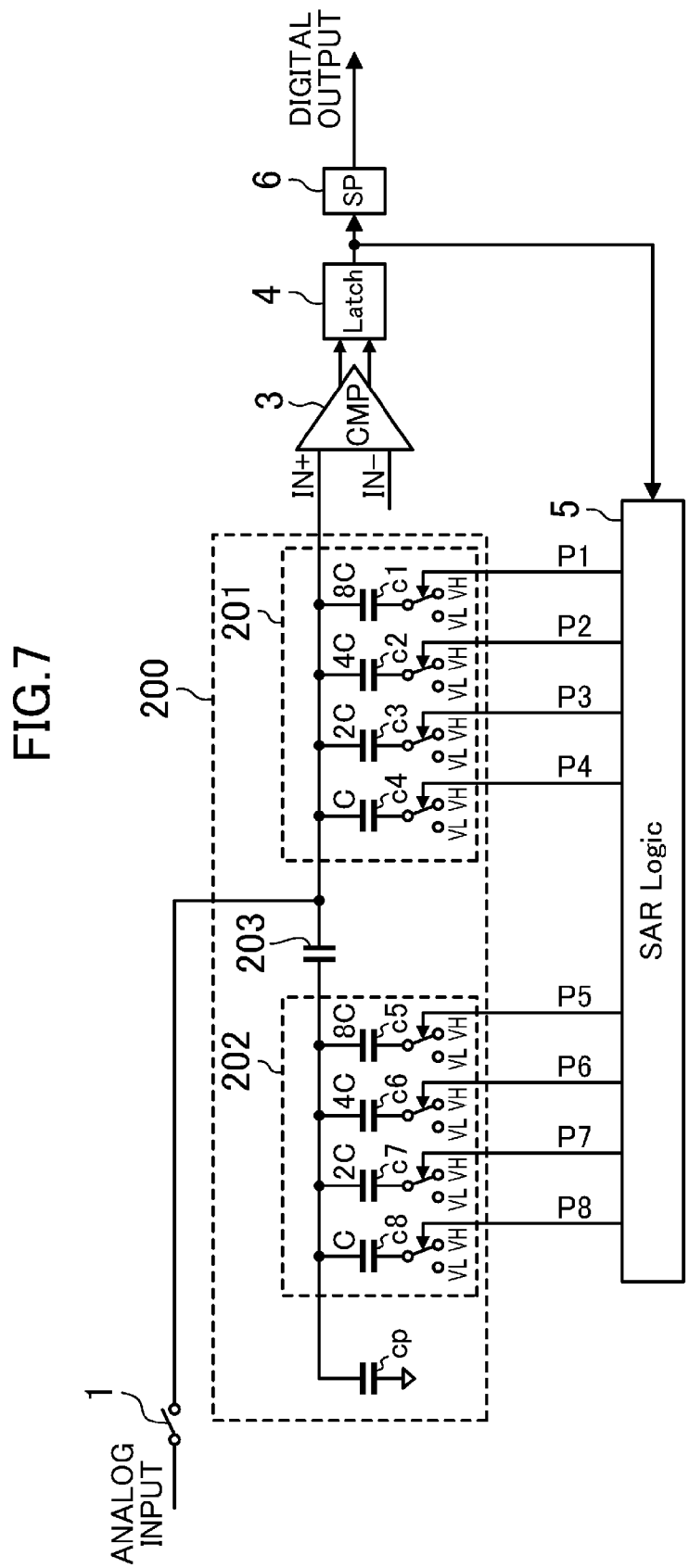
FIG. 7 is a block diagram of a conventional successive approximation AD converter.

An embodiment of the present disclosure will be described hereinafter with reference to the accompanying drawings. Note that the same components as those in FIG. 7 are denoted by the same reference characters.

Figure 1:
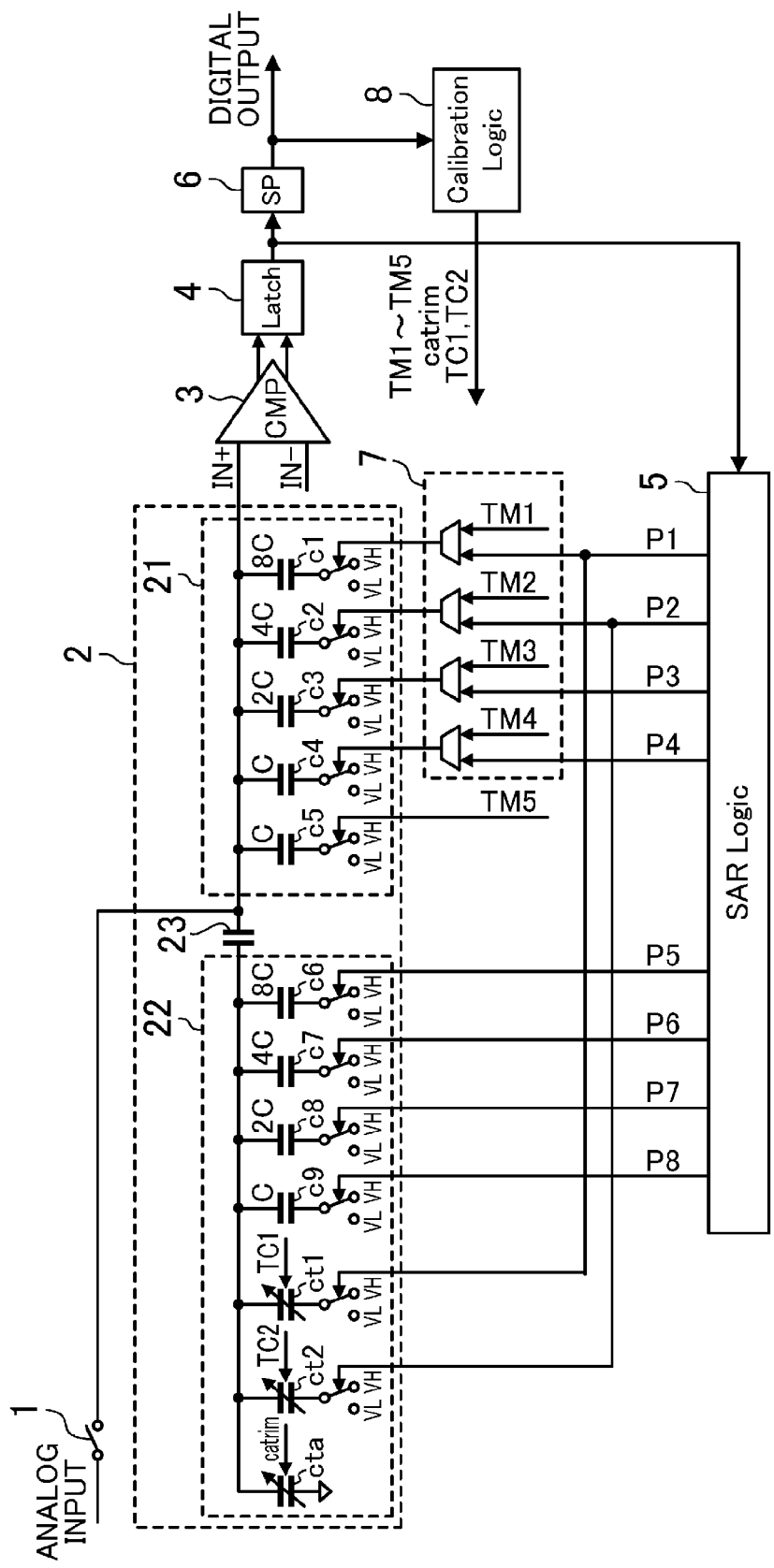
FIG. 1 is a block diagram of a successive approximation AD converter of an embodiment of the present disclosure.

FIG. 1 shows a configuration of an 8-bit successive approximation AD converter of an embodiment of the present disclosure. The successive approximation AD converter of this embodiment includes: a switch 1 that samples an analog input voltage; a capacitance DAC 2; a comparator 3; a latch circuit 4 that stores a comparison result; a successive approximation circuit 5 that outputs an 8-bit digital signal constituted by signals P1 to P8 based on an output signal of the latch circuit 4; a serial-to-parallel conversion circuit 6 that converts the output signal of the latch circuit 4 to a multi-bit signal; a higher-order DAC control circuit 7; and a correction control section 8.

FIG. 1 is depicted so that the output of the capacitance DAC 2 is connected to a non-inverting input terminal IN+ of the comparator 3 and none is connected to an inverting input terminal IN−. Actually, however, in the case that the analog input voltage is a single end signal, a voltage at the center in the input range of the successive approximation AD converter (hereinafter such a voltage is referred to as an input center voltage) is connected to the inverting input terminal IN− of the comparator 3. For example, when the input range is from 0 to Vdd, the input center voltage is Vdd/2. In the case that the analog input voltage is a differential signal, another switch 1 and another capacitance DAC 2 are provided for the negative signal of the differential signal, and the output of this capacitance DAC 2 is connected to the inverting input terminal IN− of the comparator 3.

The capacitance DAC 2 includes a higher-order DAC 21, a lower-order DAC 22, and a coupling capacitor 23 that couples these DACs.

The higher-order DAC 21 includes capacitive elements c1, c2, c3, c4, and c5. These capacitive elements are configured so that a first terminal of each element is connected to a common node, and that second terminals of the capacitive elements c1, c2, c3, and c4 are independently connected to either a reference voltage VH or VL (where VH>VL) selectively depending on the input digital signal while a second terminal of the capacitive element c5 is connected to either VH or VL selectively depending on an input correction control signal TM5. The capacitance values of the capacitive elements c1, c2, c3, and c4 are weighted with a binary ratio, which are 8C, 4C, 2C, C, respectively. The capacitance value of the capacitive element c5 is C. As will be described later, the capacitive element c5 is a dummy capacitive element used at the time of correction of capacitance mismatch in the higher-order DAC 21, and the second terminal thereof is connected to either VH or VL fixedly during normal operation.

The lower-order DAC 22 includes capacitive elements c6, c7, c8, c9, ct1, ct2, and cta. The capacitive elements ct1, ct2, and cta are variable capacitive elements of which the capacitance values are variable. These capacitive elements are configured as follows. A first terminal of each element is connected to a common node. Second terminals of the capacitive elements c6, c7, c8, and c9 are independently connected to either VH or VL selectively depending on the input digital signal. Second terminals of the variable capacitive elements ct1 and ct2 are connected to either VH or VL selectively depending on the higher-order bits of the digital signal output from the successive approximation circuit 5, i.e., the signals P1 and P2 for controlling the second terminals of the capacitive elements c1 and c2 of the higher-order DAC 21. The capacitance values of the capacitive elements c6, c7, c8, and c9 are weighted with a binary ratio, which are 8C, 4C, 2C, C, respectively.

Figure 2:
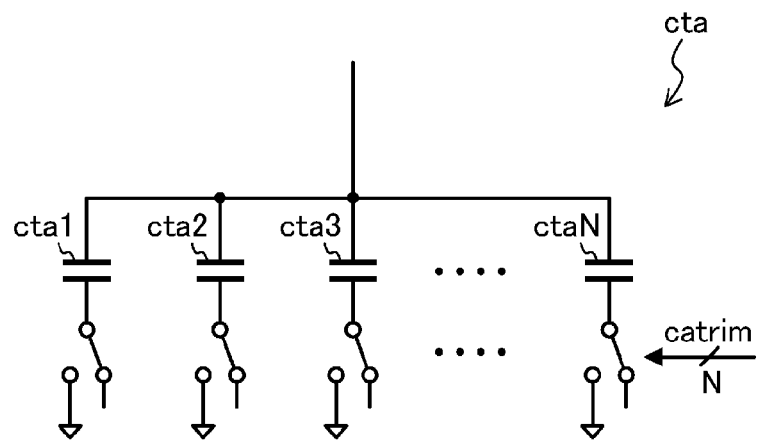
FIG. 2 is a view showing an example configuration of a variable capacitive element for parasitic capacitance value adjustment.

FIG. 2 shows an example configuration of the variable capacitive element cta. The variable capacitive element cta includes a capacitance array constituted by capacitive elements cta1, cta2, . . . , ctaN. The capacitance values of these capacitive elements may be the same or different from one another. These capacitive elements are configured so that a first terminal of each thereof is connected to the common node in the lower-order DAC 22, and second terminals thereof are independently connected to either a fixed potential (e.g., a ground potential) or a floating node selectively depending on an input control signal catrim. Therefore, by controlling the value of catrim, the parasitic capacitance value of the lower-order DAC 22 can be controlled variably.

Figure 3:
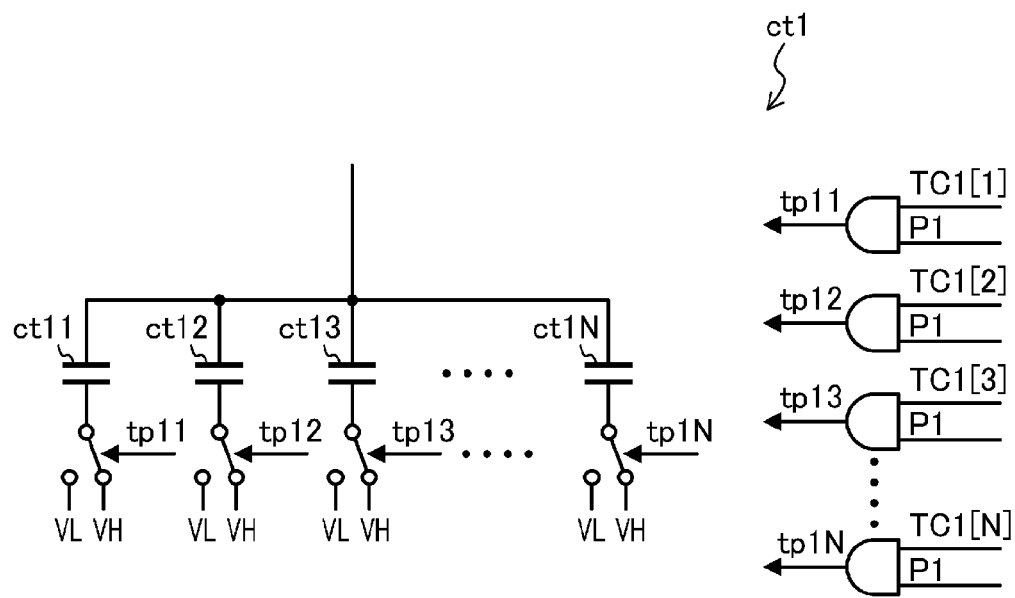
FIG. 3 is a view showing an example configuration of a variable capacitive element for capacitance mismatch correction.

FIG. 3 shows an example configuration of the variable capacitive element ct1. The variable capacitive element ct1 includes a capacitance array constituted by capacitive elements ct11, ct12, . . . , ct1N. The capacitance values of these capacitive elements may be the same or different from one another. These capacitive elements are configured so that a first terminal of each thereof is connected to the common node in the lower-order DAC 22, and second terminals thereof are independently connected to either VH or VL selectively depending on input control signals tp11, tp12, . . . , tp1N. The control signals tp11, tp12, . . . , tp1N are obtained as the results of logic operation (e.g., AND) between the corresponding bits of a control signal TC1 and the signal P1. Therefore, by controlling the value of the control signal TC1, the capacitance value of the variable capacitive element ct1 can be controlled variably. Moreover, the second terminal of the variable capacitive element ct1 can be connected to either VH or VL selectively in an interlocking manner with the second terminal of the capacitive element c1 of the higher-order DAC 21.

The variable capacitive element ct2 can also be configured in a similar manner. Therefore, by controlling the value of a control signal TC2, the capacitance value of the variable capacitive element ct2 can be controlled variably. Moreover, the second terminal of the variable capacitive element ct2 can be connected to either VH or VL selectively in an interlocking manner with the second terminal of the capacitive element c2 of the higher-order DAC 21.

Referring back to FIG. 1, the higher-order DAC control circuit 7 selectively supplies either correction control signals TM1, TM2, TM3, and TM4 or the signals P1, P2, P3, and P4 that are the higher-order bits of the digital signal output from the successive approximation circuit 5, to the higher-order DAC 21. The correction control section 8 receives the lower-order bits of the output signal of the serial-to-parallel conversion circuit 6, and, determining the control of the higher-order DAC 21 at the time of correction and determining the capacitance values of the variable capacitive elements ct1, ct2, and cta, outputs the signals TM1 to TM5, catrim, TC1, and TC2 described above. Also, the correction control section 8 controls the selection operation of the higher-order DAC control circuit 7.

The correction operation of the successive approximation AD converter of this embodiment will be described hereinafter.

<Weighting Error Correction Between Higher-Order DAC and Lower-Order DAC>

First, as the initial state, the capacitance value ca of the coupling capacitor 23 is set to a value sufficiently larger than 2C, an ideal capacitance value obtained when no parasitic capacitance is present in the lower-order DAC 22. Moreover, the catrim is set to 0 to set the capacitance value of the variable capacitive element cta to 0, whereby the capacitance value of the lower-order DAC 22 is made smaller than the capacitance value of the higher-order DAC 21 even if a parasitic capacitance is present in the lower-order DAC 22.

Figure 4:
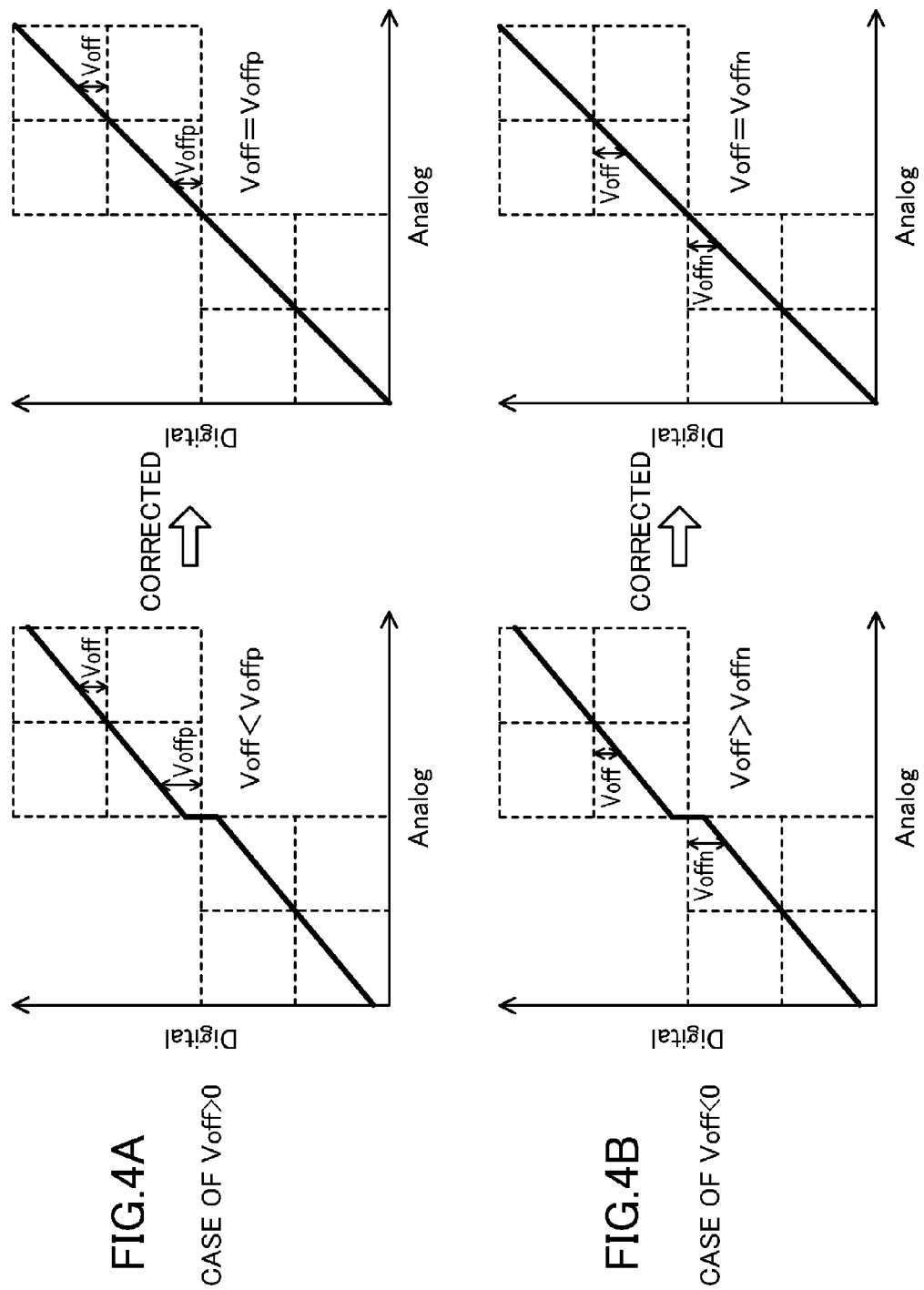
FIGS. 4A-4B show graphs representing AD conversion characteristics observed before and after weighting error correction between a higher-order DAC and a lower-order DAC.
Figure 5:
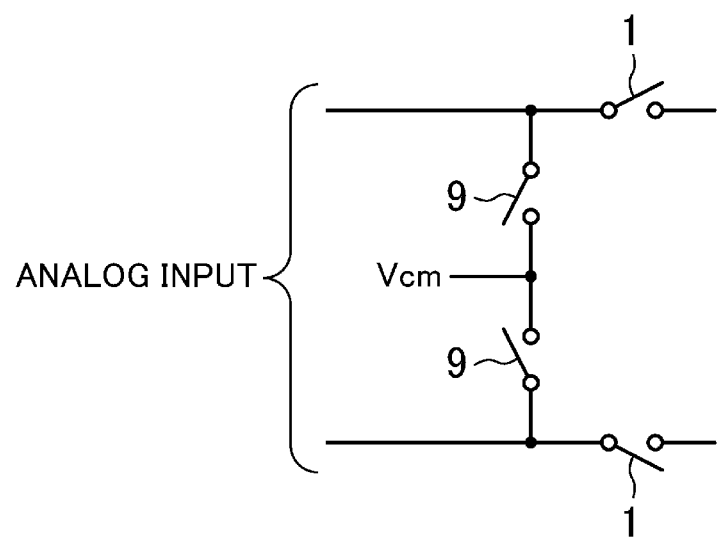
FIG. 5 is a view showing an example means for sampling an input center voltage.

FIG. 4 shows the AD conversion characteristics observed before and after weighting error correction between the higher-order DAC 21 and the lower-order DAC 22 in the case where the lowest-order bit in the higher-order DAC 21 and all the bits in the lower-order DAC 22 are used. Before error correction, since the weighting in the lower-order DAC 22 is larger compared with that in the higher-order DAC 21, a so-called missing code occurs at the junction of the higher-order part and the lower-order part, causing a nonlinear error in the AD conversion (see the left graphs in FIGS. 4A and 4B).

To correct the weighting error between the higher-order DAC 21 and the lower-order DAC 22, arrangement may be made so that an AD converted value Voff obtained when only the lower-order DAC 22 is operated and an AD converted value Voffp (see FIG. 4A) or Voffn (see FIG. 4B), depending on the sign of Voff, obtained by the lower-order DAC 22 when the lowest-order bit in the higher-order DAC 21 is forcefully operated satisfy Voff=Voffp or Voff=Voffn. By this arrangement, the higher-order part and the lower-order part are continuously coupled at the junction point, providing linear AD conversion characteristics (see the right graphs in FIGS. 4A and 4B).

The inclination of the AD conversion characteristics changes with the weighting in the lower-order DAC 22. Therefore, by increasing the capacitance value of the variable capacitive element cta provided in the lower-order DAC 22 from the state shown in the left graphs in FIGS. 4A and 4B, the inclination becomes large, resulting in satisfying Voff=Voffp or Voff=Voffn as shown in the right graphs in FIGS. 4A and 4B.

In the successive approximation AD converter of this embodiment, the AD converted values Voff, Voffp, and Voffn can be measured in the following manner. First, the correction control section 8 controls the higher-order DAC control circuit 7 to allow TM1 to TM4 to be input into the higher-order DAC 21, and fixes TM1 to TM5 to (TM1, TM2, TM3, TM4, TM5)=(1, 0, 0, 0, 0) or (0, 1, 1, 1, 1). Also, the switch 1 is closed to sample the input center voltage.

The sampling of the input center voltage can be performed in various ways. For example, a switch (not shown) that short-circuits the differential input pair of the comparator 3 may be provided and, by short-circuiting this switch, the input center voltage can be sampled. However, connection of such a switch at the input terminal of the comparator 3 will increase the parasitic capacitance, etc. It is therefore preferable to provide a means for inputting the input center voltage at a position upstream of the switch 1. For example, when the analog input voltage is a differential signal, a switch 9 may be provided between a common mode voltage Vcm and the signal input terminal of each of the switches 1, and in sampling of the input center voltage, the switches 1 and 9 may be closed.

After the sampling of the input center voltage, the switch 1 is opened, and, normal successive approximation operation is performed using only the lower-order DAC 22 while the digital inputs of the higher-order DAC 21 are fixed. Voff can be measured from the serial-to-parallel converted lower-order bits obtained when the successive approximation operation has been finished down to the lowest-order bit, according to Equation (1) below.

$$Voff = \sum_{0}^{N-1} 2^i \cdot ADi - (2^N - 1)/2 \qquad (1)$$

where N is the number of bits in the lower-order DAC 22, and ADi is the value of each of the lower-order bits of the digital signal output from the serial-to-parallel conversion circuit 6.

The value of Voff determined from Equation (1) will be 0 if the comparator 3 is in its ideal state. However, with an offset present in the comparator 3, the value of Voff is a digital value of the offset of the comparator 3.

Thereafter, Voffp when the sign of the measured Voff is positive, or Voffn when the sign of the measured Voff is negative, is measured. As in the measurement of Voff, first, the correction control section 8 controls the higher-order DAC control circuit 7 to allow TM1 to TM4 to be input into the higher-order DAC 21 and sets TM1 to TM5 to (TM1, TM2, TM3, TM4, TM5)=(0, 1, 1, 1, 1) for measurement of Voffp or (TM1, TM2, TM3, TM4, TM5)=(1, 0, 0, 0, 0) for measurement of Voffn. Also, the switch 1 is closed to sample the input center voltage. Subsequently, the switch 1 is opened, and normal successive approximation operation is performed using only the lower-order DAC 22 with TM5 being switched from 1 to 0 for measurement of Voffp, or from 0 to 1 for measurement of Voffn. Note that TM4 may be switched in place of switching TM5. After the approximation operation has been finished down to the lowest-order bit, Voffp and Voffn can be measured from the lower-order bits of the serial-to-parallel converted result according to Equation (2) and Equation (3) below, respectively.

$$Voffp = 2^N + \sum_{0}^{N-1} 2^i \cdot ADi - (2^{N+1} - 1)/2 \qquad (2)$$

$$Voffn = 0 + \sum_{0}^{N-1} 2^i \cdot ADi - (2^{N+1} - 1)/2 \qquad (3)$$

When Voffp>Voff or Voffn<Voff, indicating that the weighting of the lower-order DAC 22 is large compared with that of the higher-order DAC 21, catrim is incremented to increase the capacitance value of the variable capacitive element cta. Since this changes the weighting of the lower-order DAC 22, Voff must be re-measured. Thus, measurement of Voff and measurement of Voffp or Voffn depending on the sign of Voff are repeated with catrim being increased until Voffp=Voff or Voffn=Voff is satisfied. Once Voffp=Voff or Voffn=Voff is satisfied, then the weighting of the higher-order DAC 21 and that of the lower-order DAC 22 become equal to each other, obtaining the linear AD conversion characteristics as shown in the right graphs in FIGS. 4A and 4B.

<Capacitance Mismatch Correction in Higher-Order DAC>

A technique of correcting a mismatch error in the capacitive elements c1 and c2 of the higher-order DAC 21 will be described hereinafter.

When there are a plurality of capacitive elements to be corrected, correction is performed starting from the capacitive element corresponding to the lowest-order bit. In this embodiment, correction is performed starting from the capacitive element c2.

First, the correction control section 8 controls the higher-order DAC control circuit 7 to allow TM1 to TM4 to be input into the higher-order DAC 21 and sets TM1 to TM5 to (TM1, TM2, TM3, TM4, TM5)=(0, 1, 0, 0, 0). Also, the switch 1 is closed to sample the input center voltage.

Thereafter, the switch 1 is opened, and the correction control section 8 controls the higher-order DAC control circuit 7 to allow TM1 to TM4 to be input into the higher-order DAC 21 and sets TM1 to TM5 to (TM1, TM2, TM3, TM4, TM5)=(0, 0, 1, 1, 1). At this time, the digital input of the capacitive element c2 to be corrected is changed from 1 to 0, and the digital inputs of the capacitive elements c3, c4, and c5 corresponding to bits lower in order than that for the capacitive element c2 are changed from 0 to 1. When the capacitance ratio precision is in its ideal state, the capacitance value of the capacitive element c2 is 4C, and the total capacitance value of the capacitive elements c3, c4, and c5 is also 4C (=2C+C+C), i.e., they are equal to each other. Therefore, having the equal charge transfer amount, the potential at the common node of the higher-order DAC 21 should not be changed. However, because the weighting of the capacitance values in the higher-order DAC 21 is not ideal due to capacitance mismatch, the capacitance value of the capacitive element c2 and the total capacitance value of the capacitive elements c3, c4, and c5 fail to be equal to each other. For this reason, as a result of the above-described control, a potential change occurs at the common node of the higher-order DAC 21. By AD-converting this voltage using only the lower-order DAC 22, the above potential change can be measured in the form of a digital value using Equation (4) below.

$$VM = \sum_{0}^{N-1} 2^i \cdot ADi - (2^N - 1)/2 \quad (4)$$

Since VM obtained from Expression (4) includes the offset of the comparator 3, it does not correctly represent the mismatch error of the capacitive element c2 to be corrected. In view of this, using Voff that is the offset value of the comparator 3 calculated at the time of weighting error correction between the higher-order DAC 21 and the lower-order DAC 22, the mismatch error of the capacitive element c2 is measured from Equation (5) below.

$$Vdiff = VM - Voff \quad (5)$$

Figure 6:
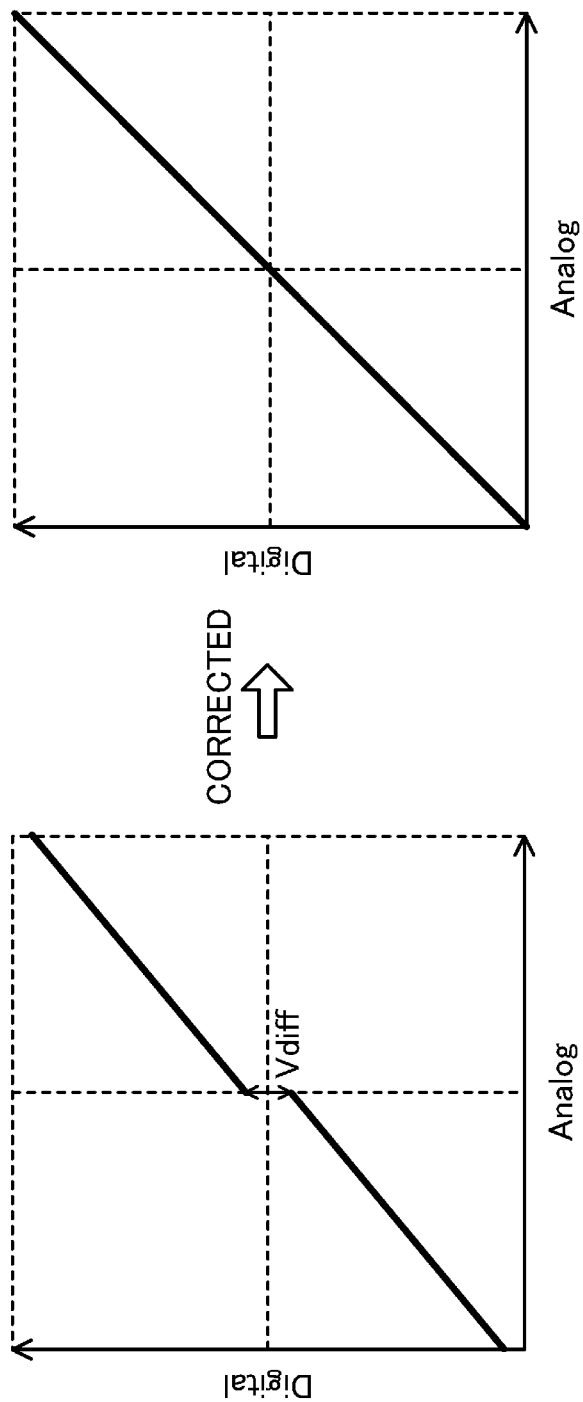
FIG. 6 shows graphs representing AD conversion characteristics observed before and after capacitance mismatch correction in the higher-order DAC.

Vdiff obtained from Expression (5) is the digital value of the mismatch error of the capacitive element c2. Therefore, as shown in FIG. 6, by adjusting the capacitance value of the variable capacitive element ct2 that is provided in the lower-order DAC 22 and interlocks with the capacitive element c2 so that Vdiff=0 is satisfied, the mismatch error of the capacitive element c2 can be corrected.

Subsequently, a mismatch correction technique for the capacitive element c1 will be described. The correction of the capacitive element c1 is performed in the state where the capacitance value of the variable capacitive element ct2 described above has been adjusted.

First, the correction control section 8 controls the higher-order DAC control circuit 7 to allow TM1 to TM4 to be input into the higher-order DAC 21 and sets TM1 to TM5 to (TM1, TM2, TM3, TM4, TM5)=(1, 0, 0, 0, 0). Also, the switch 1 is closed to sample the input center voltage.

Thereafter, the switch 1 is opened, and the correction control section 8 controls the higher-order DAC control circuit 7 to allow TM1 to TM4 to be input into the higher-order DAC 21 and sets TM1 to TM5 to (TM1, TM2, TM3, TM4, TM5) =(0, 1, 1, 1, 1). At this time, a potential change occurs at the common node of the higher-order DAC 21 due to a difference between the charge transfer amount of the capacitive element c1 to be corrected and the total charge transfer amount of the capacitive elements c2, c3, c4, and c5. By AD-converting this voltage using only the lower-order DAC 22 and using Expressions (4) and (5), mismatch error of the capacitive element c1 can be measured. The mismatch error of the capacitive element c1 is corrected by adjusting the capacitance value of the variable capacitive element ct1 that is provided in the lower-order DAC 22 and interlocks with the capacitive element c1, as in the correction of the capacitive element c2.

As described above, according to this embodiment, a non-linear error in the capacitance DAC 2 of the successive approximation AD converter can be corrected. More specifically, a mismatch error in the higher-order DAC 21 can be corrected. This makes it possible to obtain a high-precision AD converted value. Moreover, a weighting error between the higher-order DAC 21 and the lower-order DAC 22 can be corrected. This makes it possible to obtain a further high-precision AD converted value.

Note that the AD conversion resolution is not limited to 8 bits. The numbers of capacitive elements of the higher-order DAC 21 and the lower-order DAC 22 may be increased or decreased appropriately to obtain an arbitrary resolution.

The number of capacitive elements subjected to mismatch error correction in the higher-order DAC 21 is not limited to 2. When the number of capacitive elements to be corrected is to be changed, the same number of variable capacitive elements as the number of capacitive elements to be corrected in the higher-order DAC 21 may be provided in the lower-order DAC 22 and made to interlock with the control of the capacitive elements to be corrected in the higher-order DAC 21.

The capacitive elements c1 to c4, and c6 to c9 may be configured as so-called split capacitors. For example, the capacitive element c1 having a capacitance value of 8C can be constituted by two capacitive elements each having a capacitance value of 4C, a first terminal of each of which is connected to a common node and a second terminal connected selectively to either VH or VL.

What is claimed is:

1. A successive approximation AD converter configured to convert an analog input voltage to a digital value, comprising:
   a capacitance DAC including a higher-order DAC having a plurality of capacitive elements having capacitance values weighted with a binary ratio, configured so that a first terminal of each of the capacitive elements is connected to a first common node and a second terminal thereof is connected to either a first or second voltage selectively depending on each bit of an input first digital signal, a lower-order DAC having a plurality of capacitive elements having capacitance values weighted with a binary ratio, configured so that a first terminal of each of the capacitive elements is connected to a second common node and a second terminal thereof is connected to either the first or second voltage selectively depending on each bit of an input second digital signal, and a coupling capacitor configured to connect the first common node and the second common node;
   a comparator into which a voltage generated by the analog input voltage and the capacitance DAC is input;
   a successive approximation circuit configured to determine the digital value sequentially starting from its MSB in response to the comparison result of the comparator, and output higher-order bits of the digital value as a third digital signal and lower-order bits thereof as the second digital signal; and
   a higher-order DAC control circuit configured to output either a correction control signal or the third digital signal selectively to the higher-order DAC as the first digital signal, wherein
   the lower-order DAC has at least one variable capacitive element of which a first terminal is connected to the second common node and a second terminal is connected to either the first or second voltage selectively depending on a higher-order bit of the third digital signal.

2. The successive approximation AD converter of claim 1, wherein
   the higher-order DAC has a dummy capacitive element having a capacitance value equal to the capacitance value of a capacitive element corresponding to the lowest-order bit among the plurality of capacitive elements of the higher-order DAC, of which a first terminal is connected to the first common node and a second terminal is connected to either the first or second voltage selectively depending on the correction control signal.

3. The successive approximation AD converter of claim 1, wherein
the lower-order DAC has another variable capacitive element of which a first terminal is connected to the second common node and a second terminal is grounded.

4. The successive approximation AD converter of claim 2, wherein
the lower-order DAC has another variable capacitive element of which a first terminal is connected to the second common node and a second terminal is grounded.

5. The successive approximation AD converter of claim 2, further comprising:
a correction control section configured to perform generation of the correction control signal, adjustment of the capacitance value of the variable capacitive element, and control of the higher-order DAC control circuit, wherein
the correction control section measures a first AD converted value obtained when a predetermined voltage is sampled in the capacitance DAC in the state where a predetermined value is input in the higher-order DAC and a second AD converted value obtained by sampling the predetermined voltage in the capacitance DAC in the state where the second terminal of a capacitive element to be corrected in the higher-order DAC is connected to the first voltage and the second terminals of a capacitive element corresponding to a bit lower in order than the capacitive element to be corrected and the dummy capacitive element are connected to the second voltage and then operating the lower-order DAC in the state where the second terminal of the capacitive element to be corrected is connected to the second voltage and the second terminals of the capacitive element corresponding to a bit lower in order than the capacitive element to be corrected and the dummy capacitive element are connected to the first voltage, and adjusts the capacitance value of the variable capacitive element so that the first AD converted value and the second AD converted value be equal to each other.

6. The successive approximation AD converter of claim 3, further comprising:
a correction control section configured to perform generation of the correction control signal, adjustment of the capacitance values of the variable capacitive element and the another variable capacitive element, and control of the higher-order DAC control circuit, wherein
the correction control section measures a first AD converted value obtained when a predetermined voltage is sampled in the capacitance DAC in the state where a predetermined value is input in the higher-order DAC and a second AD converted value obtained by sampling the predetermined voltage in the capacitance DAC in the state where a predetermined value corresponding to the sign of the first AD converted value is input in the higher-order DAC and then operating the lower-order DAC in the state where the lowest-order bit of the first digital signal is inverted, and adjusts the capacitance value of the another variable capacitive element so that the first AD converted value and the second AD converted value be equal to each other.

7. The successive approximation AD converter of claim 4, further comprising:
a correction control section configured to perform generation of the correction control signal, adjustment of the capacitance values of the variable capacitive element and the another variable capacitive element, and control of the higher-order DAC control circuit, wherein
the correction control section measures a first AD converted value obtained when a predetermined voltage is sampled in the capacitance DAC in the state where a predetermined value is input in the higher-order DAC and a second AD converted value obtained by sampling the predetermined voltage in the capacitance DAC in the state where a predetermined value corresponding to the sign of the first AD converted value is input in the higher-order DAC and then operating the lower-order DAC in the state where the lowest-order bit of the first digital signal is inverted, and adjusts the capacitance value of the another variable capacitive element so that the first AD converted value and the second AD converted value be equal to each other.

8. The successive approximation AD converter of claim 6, wherein
the correction control section sets the capacitance value of the another variable capacitive element to the minimum and then gradually increases the capacitance value of the another variable capacitive element so that the first AD converted value and the second AD converted value become equal to each other.

9. The successive approximation AD converter of claim 7, wherein
The correction control section sets the capacitance value of the another variable capacitive element to the minimum and then gradually increases the capacitance value of the another variable capacitive element so that the first AD converted value and the second AD converted value become equal to each other.

10. The successive approximation AD converter of claim 5, further comprising:
a switch configured to short-circuit a differential input pair of the comparator.

11. The successive approximation AD converter of claim 6, further comprising:
a switch configured to short-circuit a differential input pair of the comparator.

12. The successive approximation AD converter of claim 7, further comprising:
a switch configured to short-circuit a differential input pair of the comparator.

* * * * *